United States Patent
Bickford et al.

[19]

[11] Patent Number: 6,021,320
[45] Date of Patent: Feb. 1, 2000

[54] BROADCAST RECEIVER PROVIDING SELECTABLE CATEGORIES OF AVAILABLE BROADCAST SIGNALS

[75] Inventors: Brian Lee Bickford, Kokomo; Scott Alan Wright, Fairmount; Mark David Adamski, Westfield; Brian L. McNett, Noblesville, all of Ind.

[73] Assignee: Delco Electronics Corporation, Kokomo, Ind.

[21] Appl. No.: 08/866,118

[22] Filed: Jun. 27, 1997

[51] Int. Cl.[7] .................................................. H04Q 7/20
[52] U.S. Cl. .................................... 455/186.1; 455/185.1; 455/166.1
[58] Field of Search ........................... 455/185.1, 186.1, 455/186.2, 166.1, 166.2, 161.2, 161.3

[56] References Cited

U.S. PATENT DOCUMENTS

| | | | |
|---|---|---|---|
| 4,969,209 | 11/1990 | Schwob | 455/181.1 |
| 5,063,610 | 11/1991 | Alwadish | 455/186.1 |
| 5,146,612 | 9/1992 | Grosjean et al. | 455/45 |
| 5,152,012 | 9/1992 | Schwob | 455/186.1 |
| 5,214,792 | 5/1993 | Alwadish | 455/186.1 |
| 5,239,540 | 8/1993 | Rovira et al. | 370/77 |
| 5,428,827 | 6/1995 | Kesser | 455/161.3 |
| 5,471,662 | 11/1995 | Shiota | 455/166.1 |
| 5,491,838 | 2/1996 | Takahisa et al. | 455/66 |
| 5,548,828 | 8/1996 | Kozaki et al. | 455/161.2 |
| 5,577,266 | 11/1996 | Takahisa et al. | 455/66 |
| 5,579,537 | 11/1996 | Takahisa | 455/66 |
| 5,710,992 | 1/1998 | Sawada et al. | 455/166.1 |

OTHER PUBLICATIONS

United States RBDS Standard, Aug. 1, 1992.

*Primary Examiner*—Edward F. Urban
*Assistant Examiner*—Tilahun Gesesse
*Attorney, Agent, or Firm*—Jimmy L. Funke

[57] ABSTRACT

A Broadcast receiver system includes a SNAPSHOT feature which searches one or more broadcast bands for currently receivable broadcast signals. Supplemental information accompanying each of the received broadcast signals are processed to determine a program type thereof, e.g. country, jazz, rock, news and the like. Only currently available program types are stored in memory along with all broadcast frequencies corresponding thereto. The receiver system provides means by which a user may select any of the currently available program types, whereupon the user is presented with a number of preset keys automatically programmed with the corresponding number of available broadcast frequencies within the selected program type category. The user may then depress any of the preset keys to tune to a broadcast station broadcasting the selected program type. Alternatively, the user may actuate seek or scan keys to select the broadcast stations within the selected program type.

18 Claims, 10 Drawing Sheets

BROADCAST RECEIVER PROVIDING SELECTABLE CATEGORIES OF AVAILABLE BROADCAST SIGNALS

FIELD OF THE INVENTION

The present invention relates generally to systems for receiving broadcast information, and more specifically to such systems capable of decoding supplemental data accompanying the broadcast information.

BACKGROUND OF THE INVENTION

Known broadcast systems have the capability to provide supplemental information accompanying the broadcast signal, wherein such supplemental information typically contains information related to the program being broadcast. One example of accompanying supplemental information is program type information which classifies broadcast programs into program type categories. Program types may be classified, depending upon the particular broadcast system, into broad categories such as Country, Jazz, News, Nostalgia, Sports, Rock, and the like, and may further be classified into finer categories via program type names; for example a Nostalgia type program may be further classified into 50's, 60's, 70's, Big Band, and the like.

Currently, several known broadcast standards define broadcast systems including accompanying supplemental information. One example is the EN50067 Specification of the radio data system (RDS), CENELEC, April 1992, which classifies radio programs into 31 program types. Other examples include the Specification of the radio broadcast data system (RBDS), National Radio Systems Committee, Jan. 8, 1993, and the ETS-300401 Radio Broadcasting System; Digital Audio Broadcasting (DAB) to Mobile, Portable, and Fixed Receivers, European Telecommunications Standard, June 1996.

Implementations of program type features are known to exist in RDS and DAB receiving systems. Such features allow the operator to select a program type from a list of program types, and then search the selected broadcast band for broadcast signals matching the selected program type. However, such known implementations suffer from several drawbacks associated therewith. For example, one disadvantage of known program type implementations is that the program type selection list is quite long, and a control knob or button is provided to allow the user to scroll through the list. This requires the operator to spend a significant amount of time viewing the receiver display and, in the case of on-board vehicle systems, correspondingly diverts the vehicle operator's attention from operation of the vehicle, thereby putting the operator and other vehicle operators sharing the road at risk.

Another disadvantage of known program type implementations is that when the operator selects a program type and searches the selected broadcast band for broadcast signals matching the selected program type, there is no guarantee that a broadcast signal matching the selected program type exists within the signal receiving area of the receiving system. This problem increases with the number program type categories in that the more program types that are available for selection, the less likely that a broadcast signal exists in the area for the selected program type. In many cases, selection of a program type that is not available thus results in an empty search which serves to frustrate the operator, resulting in dissatisfaction of the program type feature. In such cases, the tuner search must be reinitiated if the user wishes to find an alternate station via the program type feature. While some known receiving systems permit the operator to store favorite program types, this feature does not improve the chance of a successful signal search.

What is therefore needed is a receiving system operable to provide the operator with selectable categories of broadcast signals that are available in a particular broadcast signal receiving area. Such a system should ideally provide the user with not only available broadcast signals, but should further categorize such available broadcast signals by program type. Moreover, such a system should be readily adaptable to broadcast television systems as well as to non-broadcast communication systems, including prerecorded media-based systems, which provide communication signals with accompanying supplemental information.

SUMMARY OF THE INVENTION

The foregoing shortcomings of the prior art are addressed by the present invention. In accordance with one aspect of the present invention, a method of creating selectable categories of available communication signals in a communication receiver operable to receive and decode communication signals having accompanying supplemental information comprises the steps of searching a range of communication frequencies for available communication signals and, for each available communication signal detected, performing the steps of determining a signal category from decoded supplemental information accompanying the communication signal, creating the signal category in a memory of the communication receiver unless the signal category preexists therein, and storing in the signal category of the memory a communication frequency of the communication signal.

In accordance with another aspect of the present invention, a method of selectively tuning a receiver to available communication frequencies of various program types in a communication receiver operable to receive and decode communication signals having accompanying program type information comprises the steps of searching a range of communication frequencies for available communication signals, determining a program type of each available communication signal from program type information thereof, storing available program types in a memory of the communication receiver, storing communication frequencies of each of the available communication signals in the memory according to program type, selecting one of the program types stored in the memory, selecting one of the communication frequencies of the selected program type, and tuning the communication receiver to the communication frequency of the selected communication signal.

In accordance with yet another aspect of the present invention, a communication receiver comprises a keypad including a number of keys each responsive to user depression thereof to produce a predefined key signal, tuning and decoding circuitry for receiving and decoding communication signals having accompanying supplemental information, and a computer connected to the keypad and to the tuning and decoding circuitry. The computer includes means responsive to depression of a first one of the keys for directing the tuning and decoding circuitry to search a first range of communication frequencies for available communication signals, means for determining from the decoded supplemental information a signal category for each available communication signal, means for storing the signal categories, and means for storing communication frequencies of each of the available communication signals according to signal category.

One object of the present invention is to provide a communication signal receiving system operable to search a range of communication signal frequencies for available communication signals with accompanying supplemental information, and provide therefrom user selectable categories of the communication signals.

Another object of the present invention is to provide such a system for determining signal categories from the supplemental information accompanying the available communication signals.

A further object of the present invention is to provide such a system for storing the signal categories and associated available communication signals within a memory of the receiving system.

These and other objects of the present invention will become more apparent from the following description of the preferred embodiment.

DESCRIPTION OF THE PREFERRED EMBODIMENTS

Figure 1:
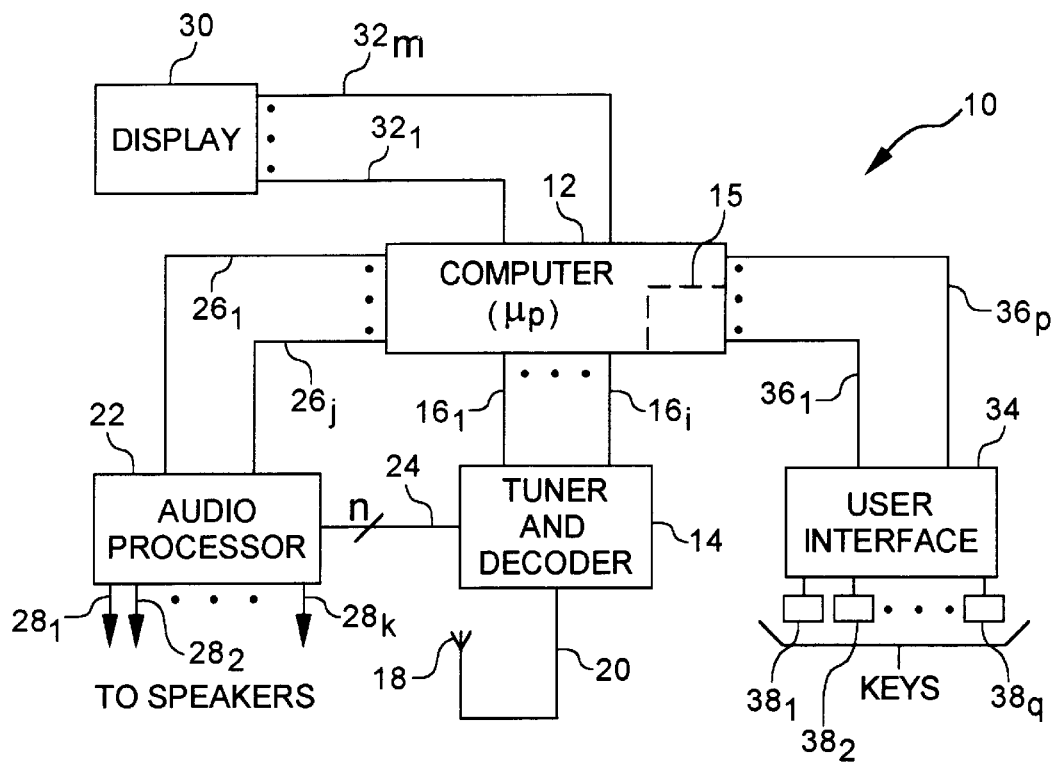
FIG. 1 is a schematic diagram of one preferred embodiment of a broadcast receiver for providing selectable categories of available broadcast signals, in accordance with one aspect of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated devices, and such further applications of the principles of the invention as illustrated therein being contemplated as would normally occur to one skilled in the art to which the invention relates.

Referring now to FIG. 1, a schematic diagram of one preferred embodiment of a broadcast receiver system 10 for providing selectable categories of available broadcast signals, in accordance with one aspect of the present invention, is shown. Central to receiver system 10 is a computer 12, preferably microprocessor-based, as illustrated. Computer 12 includes a memory unit 15 and is connected to known tuner and decoder circuitry 14 via a number of signal paths $16_1$–$16_i$, wherein I may be any integer. An antenna 18 is connected to tuner and decoder circuitry 14 via signal path 20. As is known in the art, tuner and decoder circuitry 14 is operable to receive communication signals, such as broadcast signals, via antenna 18, and is responsive to a frequency signal command provided thereto by computer 12 via one or more signal paths $16_1$–$16_i$ to tune the receiver to the commanded frequency signal. Tuner and decoder circuitry 14 is further operable to decode communication signals present in a band of frequencies about the commanded frequency signal for program content.

Known audio processing circuitry 22 is connected to tuner and decoder circuitry via signal path 24 which may include any number, n, of actual signal paths. Audio processing circuitry 22 is further connected to computer 12 via signal paths $26_1$–$26_j$, wherein j may be any integer. Audio processing circuitry 22 further includes a number of signal paths $28_1$–$28_k$, wherein k may be any integer. As is known in the art, audio processor circuitry 22 is operable to receive decoded signals from tuner and decoder circuitry 14 and, under the direction of computer 12, process such signals and provide audio signals corresponding thereto to a number of speakers or further audio signal processing circuitry via signal paths $28_1$–$28_k$.

Receiver system 10 further includes a display 30 connected to computer 12 via signal paths $32_1$–$32_m$, wherein m may be any integer. Display 30 is operable, under the direction of computer 12, to provide a visual display of certain operating characteristics of receiver system 10.

Receiver system 10 further includes a user interface 34 connected to computer 12 via a number of signal paths $36_1$–$36_p$, wherein p may be any integer. User interface 34 includes a keypad including a number of keys $38_1$–$38_q$, wherein q may be any integer. Those skilled in the art will recognize that any one or more of the keys $38_1$–$38_q$ may be replaced by another type of switch, button or rotary knob, where appropriate, without detracting from the subject matter of the present invention. Preferably, keys $38_1$–$38_q$ are each responsive to user depression thereof to produce a predefined key signal. While some of the key functions are known and typically included with many receiver systems, others are unique to the present invention as will be described more fully hereinafter.

Figure 2:
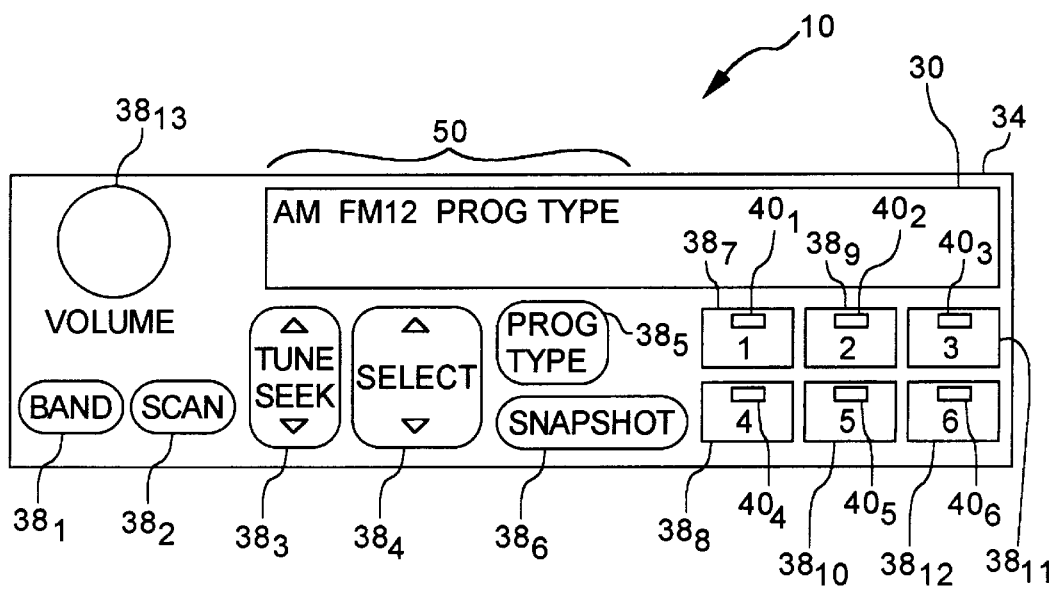
FIG. 2 is a diagrammatic illustration of one preferred embodiment of the user interface of FIG. 1, in accordance with another aspect of the present invention.

Referring now to FIG. 2, a diagrammatic illustration of one preferred embodiment of the user interface 34 of FIG. 1, in accordance with another aspect of the present invention, is shown. User interface 34 is shown in FIG. 2 as a front panel of receiver system 10, which may be embodied in a motor vehicle. It is to be understood, however, that although user interface 34 is shown in FIG. 2 as incorporated into a motor vehicle receiver unit, the present invention contemplates providing user interface 34 as a hand held remote unit or as incorporated into a fixed position receiver unit such as a home stereo system or television monitor. In any event, user interface 34, in the embodiment shown in FIG. 2 includes display 30 incorporated therein, which is preferably formed in accordance with known liquid crystal display (LCD), light emitting diode (LED) or vacuum fluorescent display (VFD) technology. Display 30, preferably includes an icon section 50 including a number of predetermined indicators for displaying certain operating characteristics of receiver system 10 when enabled. For example, icon section 50 preferably includes a frequency band indicator which indicates the current broadcast band or channel selection. A BAND key $38_1$ is responsive to user depression thereof to switch between AM and FM broadcast bands, and further between FM1 and FM2 channels as is known in the art.

Icon section 50 further includes a PROG TYPE indicator which provides a visual indication of the status of the program type mode of operation of the present invention. A PROG TYPE key $38_5$ is responsive to user depression thereof to switch between normal receiver operation, wherein the PROG TYPE icon is not displayed, and the program type operational mode of the present invention, wherein the PROG TYPE icon is displayed as shown.

User interface 34 further includes a SNAPSHOT key $38_6$ which is responsive to user depression thereof to perform the SNAPSHOT function of the present invention when the program type operational mode is enabled. One embodiment of the SNAPSHOT feature of the present invention will be discussed more fully hereinafter.

User interface further includes a SELECT key $38_4$ which is responsive to user depression thereof to select a program type when the program type operational mode is enabled. Preferably, computer 12 is responsive to user depression of the SELECT key $38_4$ to advance the program type category to the alphabetically next program type category when the program type operational mode is enabled, although the present invention contemplates that computer 12 may be responsive to user depression of the SELECT key $38_4$ to advance to a next program type in a user definable sequence of available program types.

User interface 34 further includes several known keys or buttons for activating or enabling known receiver functions. For example, user interface 34 preferably includes a SCAN key $38_2$ which is responsive to user depression thereof to direct computer 12 to operate in accordance with a SCAN function. As is known in the art, computer 12 is operable in a SCAN function to sequentially search in the selected frequency band for the next available program frequency, permit tuning and decoding of the program frequency for a predetermined time period, search for the next available program frequency, and so on. Receiver 12 is typically operable in such a SCAN mode to circularly SCAN through all available program frequencies in the selected frequency band until detection of a second depression of the SCAN key $38_2$, at which time the currently tuned program frequency is maintained. As it relates to the present invention, computer 12 is responsive to the SCAN key $38_2$ in the program type operational mode to continuously SCAN, as described above, through all available program frequencies in the selected program type.

As another example, user interface includes a TUNE/SEEK key $38_3$ which is responsive to user depression thereof to direct computer 12 to direct tuner and decoder circuitry 14 to seek the next or previous available program frequency in the selected frequency band, depending upon whether the key is depressed at the up arrow or down arrow respectively. As it relates to the present invention, computer 12 is responsive to the TUNE/SEEK key $38_3$ in the program type operational mode to direct tuner and decoder circuitry 14 to seek the next or previous available program frequency in the selected program type, depending upon whether the key is depressed at the up arrow or down arrow respectively.

As yet another example, user interface 34 further includes a VOLUME button $38_{13}$ which is responsive, as is known in the art, to user actuation thereof to control the volume of the reproduced program. Those skilled in the art will recognize that VOLUME button $38_{13}$ may alternatively be replaced with a key similar to key $38_3$ or $38_4$ without detracting from the concepts of the present invention.

As still a further example, user interface 34 also includes a number of PRESET keys each responsive to user depression thereof to direct tuner and decoder circuitry 14, via computer 12, to tune and decode a particular program frequency. In one preferred embodiment, user interface 34 includes six such PRESET keys $38_7$–$38_{12}$, although the present invention contemplates providing for more or less such keys. As is known in the art, each PRESET key $38_7$–$38_{12}$ is user programmable to a desired program frequency in the normal receiver operational mode. As it relates to the present invention, computer 12 programs one or more of the PRESET keys $38_7$–$38_{12}$ in the SNAPSHOT operation of the program type operational mode to the available program frequencies in each of the available program types. For example, if, in a given reception area, receiver system 10 determines that only two rock programs and four news programs are available during the SNAPSHOT operation, then PRESET keys $38_7$, $38_9$, $38_{11}$ and $38_8$ are programmed for the signal frequencies of the four news programs when the news program type is selected via the SELECT key $38_4$, and PRESET keys $38_7$ and $38_9$ are programmed for the signal frequencies of the two rock programs when the rock program type is selected via the SELECT key $38_4$.

Figure 5:
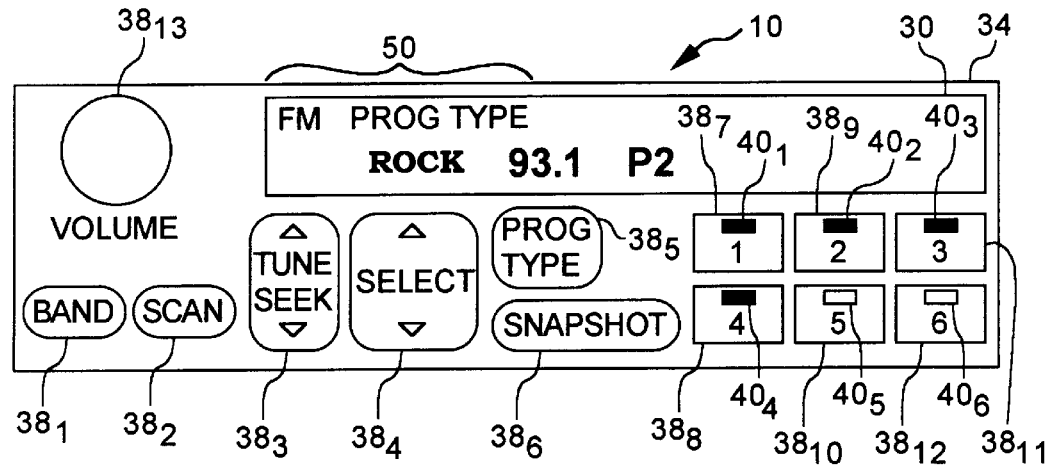
FIG. 5 is a diagrammatic illustration of the user interface of FIG. 2 showing broadcast receiver operation thereof in accordance with the present invention.

To facilitate determination of the number of available program frequencies in any given program type category, PRESET keys $38_7$–$38_{12}$ are preferably provided with indicator lights $40_1$–$40_6$ which illuminate in the program type operational mode when the corresponding PRESET key is programmed for an available program frequency. Thus, in the example just given, indicator lights $40_1$–$40_4$ are illuminated when the news program type is selected and indicator lights $40_1$–$40_2$ are illuminated when the rock program type is selected. Preferably, indicator lights $40_1$–$40_6$ are LEDs, although the present invention contemplates providing indicator lights $40_1$–$40_6$ via any light source known in the art. Alternatively, computer 12 may direct display 30 to display an indicator of the currently selected PRESET key and/or available PRESET keys. An example of such a feature is illustrated in FIG. 5 wherein indicator P2 of display 30 indicates that PRESET key $38_9$ has been selected and corresponds to broadcast frequency 93.1 Hz in the ROCK program type.

Referring now to FIG. 3, which is composed of FIGS. 3A–3D, a flowchart is shown illustrating one preferred embodiment of a software algorithm 100, executable by computer 12, for implementing the program type feature of the present invention in a receiver system such as system 10 illustrated in FIGS. 1 and 2. It is to be understood that algorithm 100 illustrates only certain steps related to the present invention and that computer 12 controls and manages the overall operation of receiver system 10, and thus typically executes software steps not shown in algorithm 100. In any event, the steps of algorithm 100 will be discussed with the aid of FIGS. 4–9 to describe the program type operational mode of the present invention.

Figure 3A:
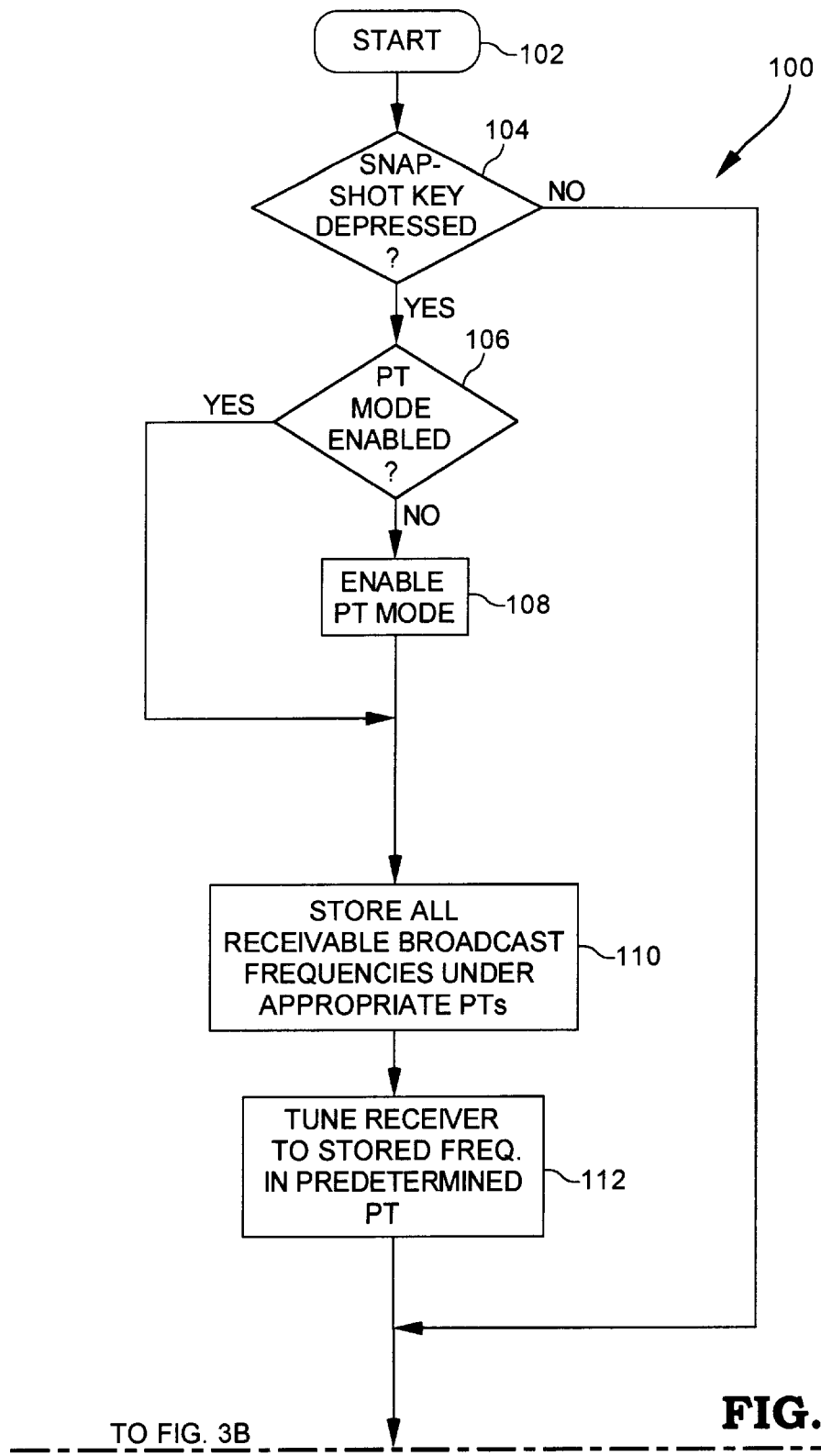
FIG. 3 is composed of FIGS. 3A–3D and is a flowchart illustrating one preferred embodiment of a software algorithm for implementing the present invention in a system such as that illustrated in FIG. 1.

Referring to FIG. 3A, algorithm 100 begins at step 102 and at step 104, control computer 12 determines whether the SNAPSHOT key $38_6$ has been depressed. If not, algorithm execution continues at step 114 of FIG. 3B. If, on the other hand, computer 12 determines at step 104 that the SNAPSHOT key $38_6$ has been depressed, algorithm execution continues at step 106 where computer 12 determines whether the program type (PT) operational mode of the present invention is currently enabled. If so, algorithm execution continues at step 110. If, at step 106, computer 12 determines that the PT operational mode is not currently enabled, algorithm execution continues at step 108 where computer 12 enables the PT operational mode. Computer 12 is thus responsive to depression of the SNAPSHOT key $38_6$ to enter the program type operation mode of the present invention if the PT mode is not currently enabled.

Preferably, computer 12 enables the program type operational mode of the present invention, at step 108, by displaying the PROG TYPE indicator in section 50 of display 30, displaying the most recent SNAPSHOT information and directing the tuner and decoder circuitry 14 to tune and decode the signal frequency corresponding to that programmed in the first PRESET key $38_7$ of one of the program types. In one preferred embodiment, receiver system 10 enters the program type operational mode according to the most recently used program type, although the present invention contemplates entering the program type operational mode according to alternate program types such the alphabetically first available program type. An example of step 108 is illustrated in FIG. 5 wherein display 30 displays the FM and PROG TYPE icons in the indicator section 50 thereof and displays the most recently selected program type (ROCK). In this example, the SNAPSHOT function resulting in the program type operational mode illustrated in FIG. 5 produced four available program frequencies which are associated with PRESET keys $38_7$, $38_9$, $38_{11}$ and $38_8$ as illustrated by the illuminated lights $40_1$–$40_4$, and the program frequency 93.1 MHZ associated with the second PRESET key $38_7$ is tuned and decoded by the tuner and decoder circuitry 14 as illustrated by the display of 93.1 and P2 in display 30. In the program type operational mode, the SELECT key $38_4$ may be depressed as described above to select an alternate program type.

Figure 6:
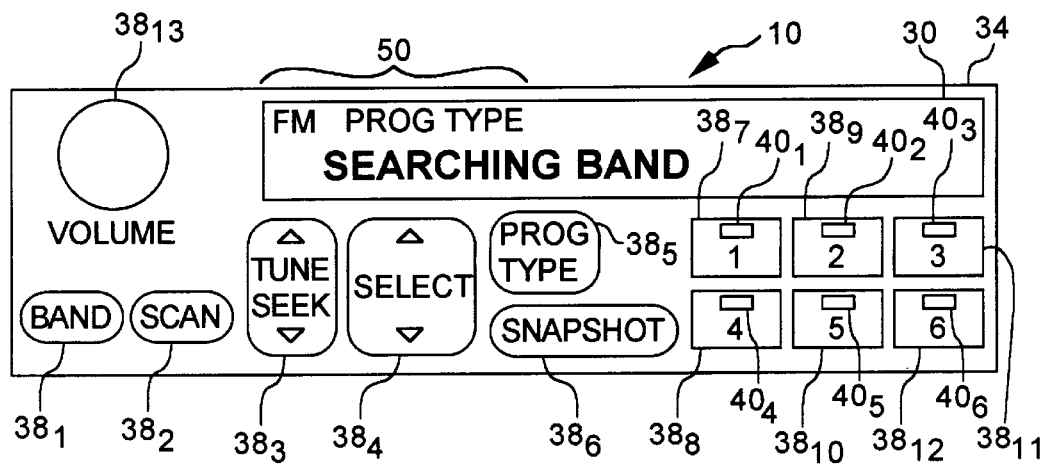
FIG. 6 is a diagrammatic illustration of the user interface of FIG. 2 showing a program type snapshot operational mode thereof.

Referring again to FIG. 3A, algorithm execution continues from either the YES branch of step 106 or from step 108 at step 110 where computer 12 directs tuner and decoder circuitry 14 to perform the SNAPSHOT function of the present invention by searching the FM signal band to determine what program frequencies are receivable thereby, and storing all receivable (available) program frequencies under appropriate program types. At the time of filing the present application, no AM broadcast systems are known to exist wherein supplemental information accompanies the broadcast signal. However, it is to be understood that the present invention contemplates adapting receiver system 10 to accommodate AM broadcast systems including such capability. In such a system, computer 12 would be operable at step 110 to direct tuner and decoder circuitry 14 to perform the SNAPSHOT function by searching both the AM and FM signal bands to determine what program frequencies are receivable thereby, and storing all such receivable program frequencies under appropriate program types. FIG. 6 illustrates a preferred status of display 30 during such a SNAPSHOT function wherein a SNAPSHOT identifying message, such as "SEARCHING BAND" or similar indicator indicating that receiver system 10 is currently operating in a SNAPSHOT mode, is displayed on display 30. Optionally, the frequency band being searched (FM) and/or the PROG TYPE icon may be displayed in the icon section 50 as illustrated in FIG. 6.

Figure 7:
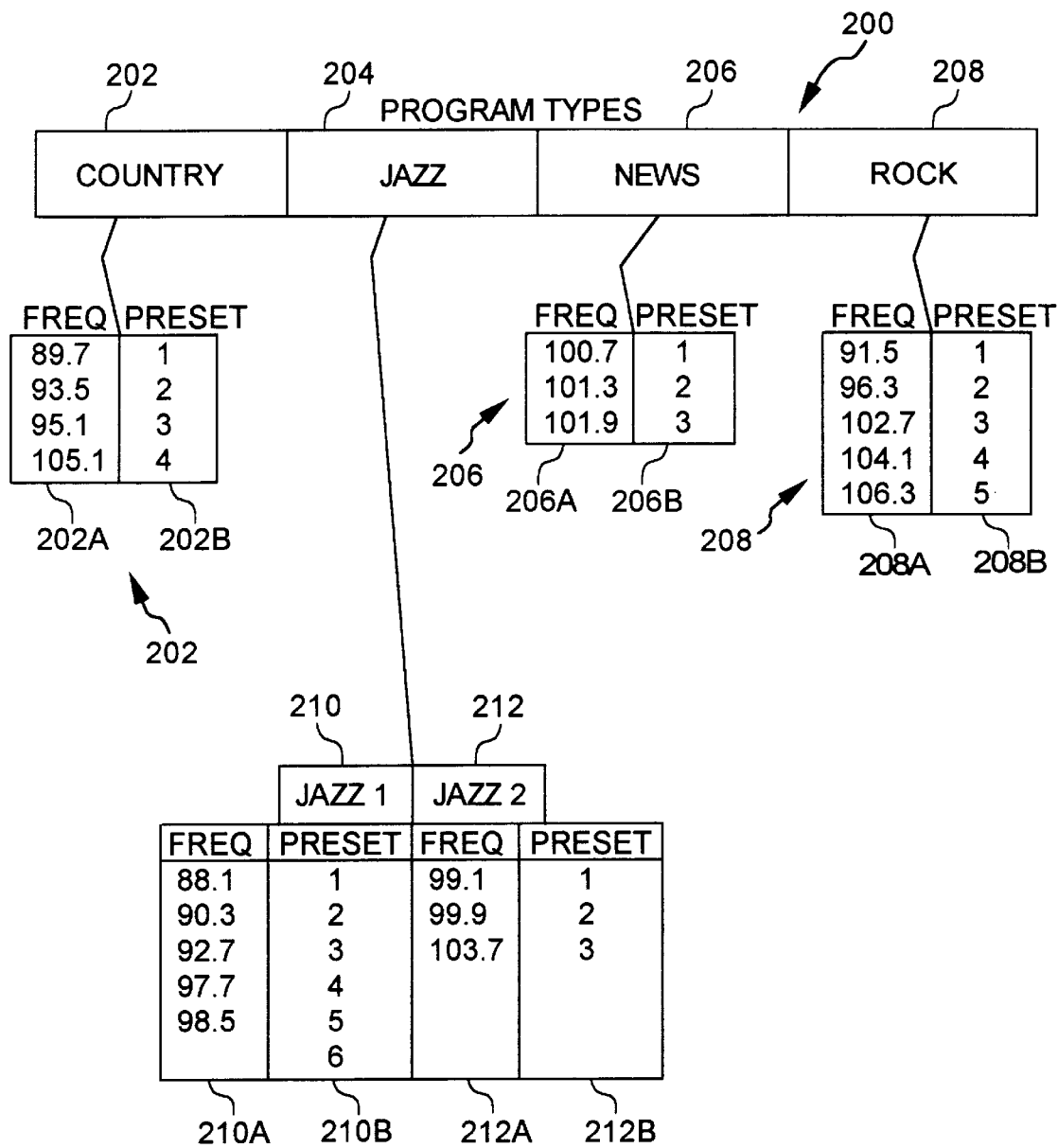
FIG. 7 illustrates a simplified example of one preferred embodiment for creating selectable categories of available broadcast signals during the program type snapshot operational mode, in accordance with the present invention.

Referring now to FIG. 7, a simplified example of one preferred embodiment of the SNAPSHOT feature of the present invention is illustrated. The example of FIG. 7 illustrates that broadcast signals corresponding to only four program types are available to the receiver system 10 at the time and location of the SNAPSHOT operation. Specifically, broadcast signals corresponding to country 202, jazz 204, news 206 and rock 208 program types were found to be available in the signal search. Within the country program type 202, four available program frequencies were found and the four frequencies 202A corresponding thereto are stored in the memory 15 of computer 12 and associated with certain PRESET keys. For example, the FM signal frequencies 89.7, 93.5, 95.1 and 105.1 MHZ are associated with PRESETs 1–4 202B so that PRESET key $38_7$ corresponds to PRESET 1, PRESET key $38_9$ corresponds to PRESET 2, PRESET key $38_{11}$ corresponds to PRESET 3, and PRESET key $38_8$ corresponds to PRESET 4.

Within the jazz program type 204, nine available program frequencies were found, which exceeds the available number of PRESET keys. In such a case, the jazz program type category 204 is preferably partitioned into two program type subcategories jazz1 210 and jazz2 212. In the jazz1 program type subcategory 210, the first six, i.e. numerically lowest, frequencies 210A are stored in PRESETS 1–6 210B of memory 15, corresponding to PRESET keys $38_7$–$38_{12}$, and in the jazz2 program type subcategory 212, the remaining three frequencies 212A are stored in PRESETS 1–3 212B of memory 15, corresponding to PRESET keys $38_7$, $38_9$ and $38_{11}$.

In the example of FIG. 7, three available program frequencies in the news program type are available, and each of the frequencies 206A are stored in PRESETS 1–3 206B, corresponding to PRESET keys $38_7$, $38_9$ and $38_{11}$ respectively. Finally, five available program frequencies in the rock program type are available, and each of the frequencies 208A are stored in PRESETS 1–5 208B, corresponding to PRESET keys $38_7$, $38_9$, $38_{11}$, $3_8$ and $38_{10}$ respectively.

In constructing the program type and associated program frequency categories of FIG. 7, computer 12 is operable to direct the tuner and decoder circuitry 14 to search the FM frequency band and, for each received broadcast signal, computer 12 is operable to determine from the decoded supplemental information accompanying the broadcast signal a program type category. If the program type category is not currently stored within memory 15, computer 12 stores the newly discovered program type category therein. Computer 12 is further operable to determine from the broadcast signal the broadcast frequency thereof. The detected broadcast frequencies are then stored by computer 12 under the program type category corresponding thereto. Other information available in the supplemental information for each available broadcast frequency is also collected and stored within memory 15. An example of such other information includes the broadcasting station's call letters or other identifier. As an alternative to displaying the broadcast frequency of the currently tuned station on display 30, the present invention contemplates displaying such broadcast station identifying information on display 30. In any case, computer 12 is thus operable in the SNAPSHOT mode to create, in memory 15, selectable categories of program types and corresponding program frequencies for later recall and tuning/decoding thereof as described above. Thus, only currently available program types and corresponding program frequencies are available to the user, which serves to shorten the program type selection list, in some instances significantly, thereby resulting in simplified program type selection.

Figure 8:
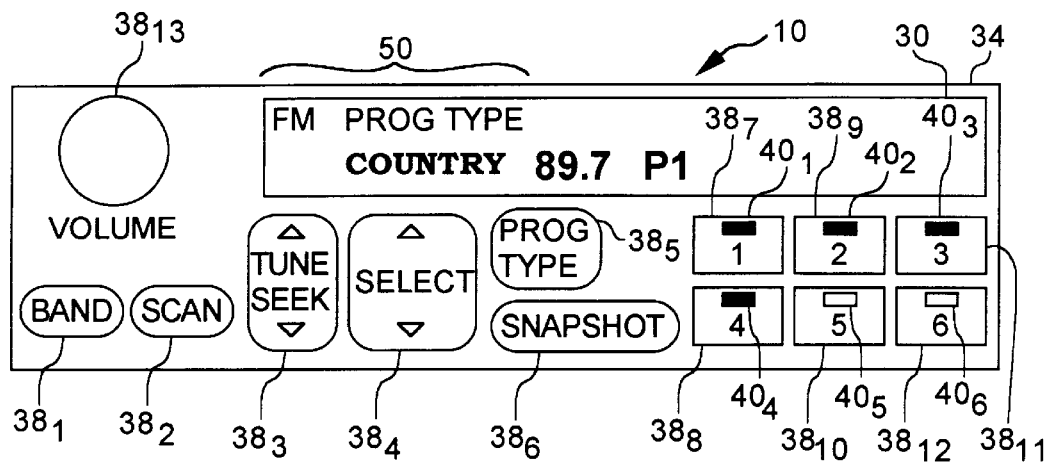
FIG. 8 is a diagrammatic illustration of the user interface of FIG. 2 showing selectability of available broadcast signals after completion of the program type snapshot operation of FIG. 7, in accordance with the present invention.

Referring again to FIG. 3A, algorithm execution continues from step 110 at 112 where, after completion of the SNAPSHOT function, computer 12 directs the tuner and decoder circuitry 14 to tune the receiver system 10 to one of the stored program frequencies in a predetermined one of the program type categories. In one preferred embodiment, step 112 is carried out by tuning the receiver system 10 to the first PRESET signal frequency in the alphabetically first program type category. This step is illustrated in FIG. 8 wherein display 30 indicates that, following the SNAPSHOT operation of step 110, receiver system 10 is tuned to the first PRESET signal frequency (89.7 MHZ) of the alphabetically first program type (country) in the FM broadcast band. Alternatively, the present invention contemplates other receiver scenarios following a SNAPSHOT operation such as, for example, providing for user programmability of an ordered list of preferred program types following the SNAPSHOT function.

Figure 3B:
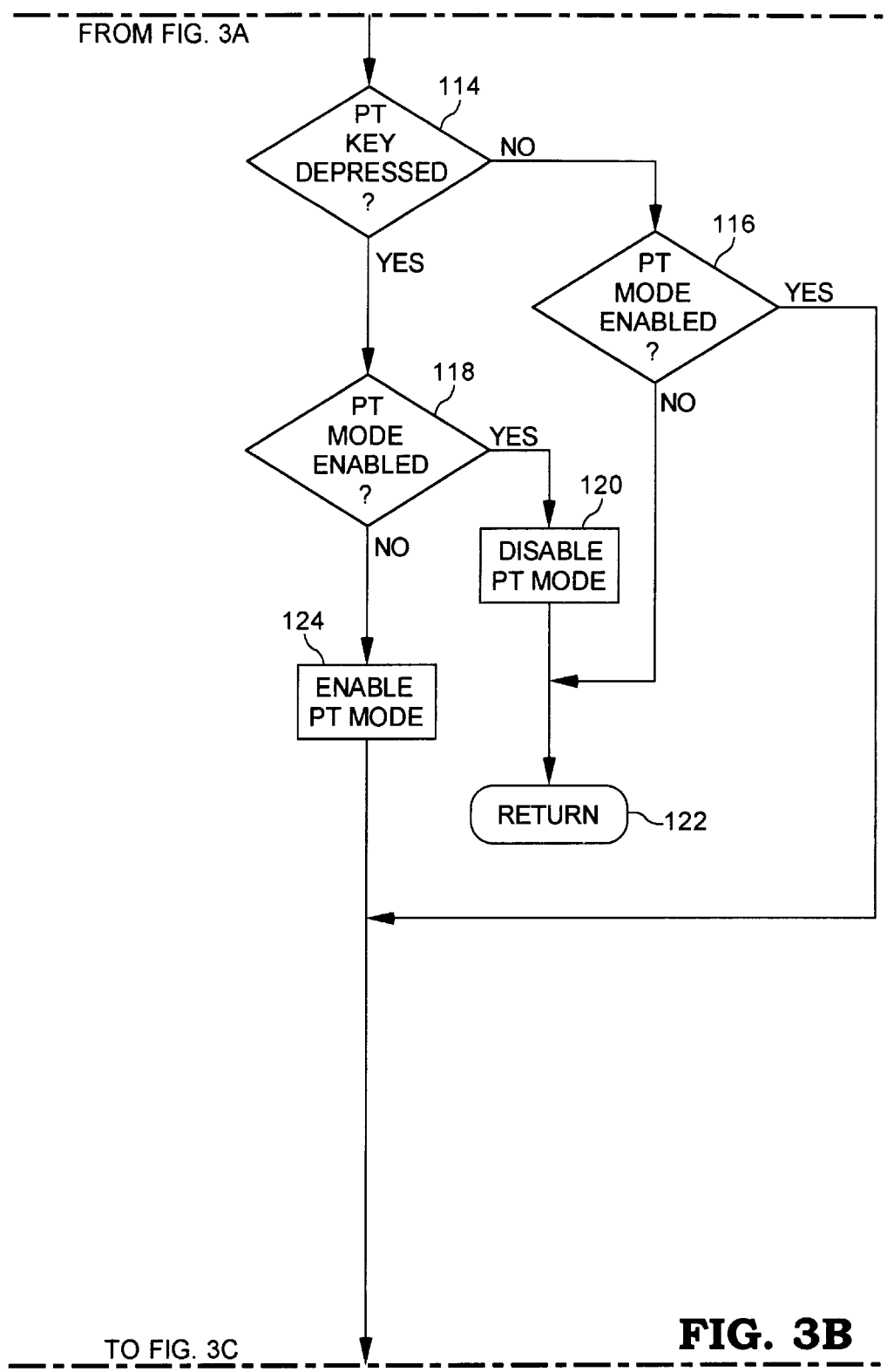

Referring now to FIG. 3B, algorithm execution continues from either the NO branch of step 104 or from step 112 to step 114 where control computer 12 determines whether the PROG TYPE (PT) key $38_5$ has been depressed. If, at step 114, the PT key $38_5$ has not been depressed, algorithm execution continues at step 116 where computer 12 determines whether the program type (PT) mode is enabled (via previous depression of PROG TYPE key $38_5$). If, at step 116, computer 12 determines that the PT mode is enabled, algorithm execution continues at step 126 of FIG. 3C. On the other hand, if, at step 116, computer 12 determines that the PT mode is not enabled, then algorithm execution continues at step 122 where algorithm 100 returns to its calling routine (or alternatively loops back to step 102).

Figure 4:
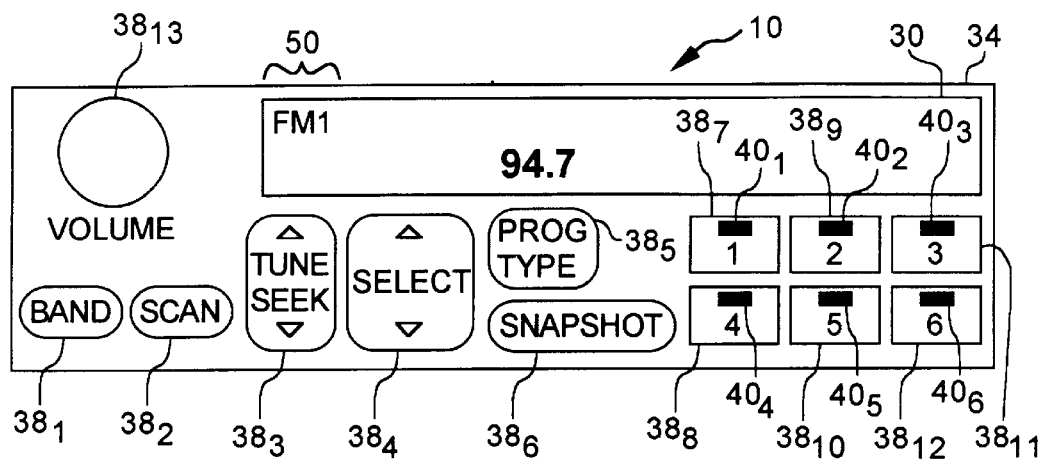
FIG. 4 is a diagrammatic illustration of the user interface of FIG. 2 showing known broadcast receiver operation thereof.

If, at step 114, computer 12 determines that the PT key $38_5$ has been depressed, algorithm execution continues at step 118 where computer 12 determines whether the PT mode is currently enabled. If so, algorithm execution continues at step 120 where computer 12 disables the program type mode by blanking the PROG TYPE icon in the icon section 50 of display 30, and continues thereafter at step 122 where the algorithm 100 is returned to its calling routine (or alternatively loops back to step 102). Whether step 122 is reached via step 116 or step 120, the program type operational mode of the present invention is disabled and receiver system 10 operates in a known normal mode, an example of which is illustrated in FIG. 4. Referring to FIG. 4, display 30 displays the frequency of the currently tuned program frequency (94.7 MHZ), or alternatively the time of day, as well as the selected FM1 frequency band in icon section 50 thereof. In this normal mode of operation, the SELECT $38_4$ and PROG TYPE $38_5$ keys are not used and the BAND $38_1$, SCAN $38_2$, TUNE/SEEK $38_3$, SNAPSHOT $38_6$ and PRESET $38_7$–$38_{12}$ keys, as well as volume knob $38_{13}$, are operational as discussed hereinabove. In the example illustrated in FIG. 4, PRESET key lights $40_1$–$40_6$ of PRESET keys $38_7$–$38_{12}$ are each illuminated indicating that all six PRESET keys are programmed, either via user preference or by default, to particular broadcast frequencies.

Referring again to FIG. 3B, if, at step 118, computer 12 determines that the program type operational mode not enabled, algorithm execution continues at step 124 where computer 12 enables the program type operational mode of the present invention. Preferably, computer 12 carries out step 124 in an identical manner to that described hereinabove with respect to step 108. In the present embodiment, the PROG TYPE key 38, may thus be used to enable and disable the program type operational mode of the present invention.

Figure 3C:
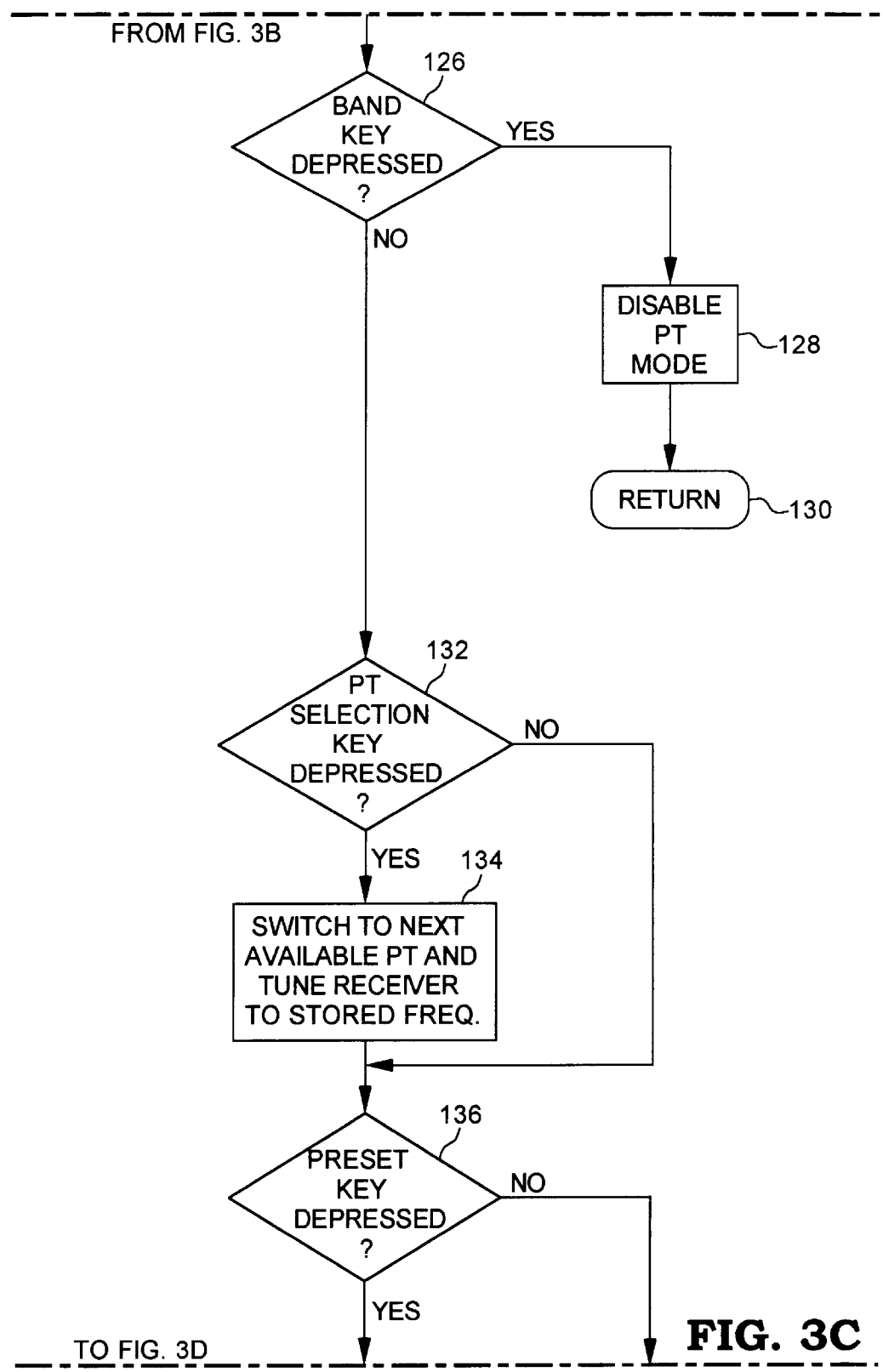

Referring now to FIG. 3C, algorithm execution continues from either the YES branch of step 116 or from step 124 at step 126 where computer 12 determines whether the BAND key $38_1$ has been depressed. If not, algorithm execution continues at step 132. If, on the other hand, computer 12 determines at step 126 that the BAND key 38, has been depressed, algorithm execution continues at step 128 where computer 12 disables the program type operational mode and returns the algorithm 100 to its calling routine thereafter at step 130 (or alternatively loops back to step 102).

Algorithm execution continues from the No branch of step 126 at step 132 where computer 12 determines whether the program type SELECTION key $38_4$ has been depressed. If not, algorithm execution continues at step 136. If, at step 132, computer 12 determines that the SELECTION key $38_4$ has been depressed, algorithm execution continues at step 134 where computer 12 switches to the next available program type and directs tuner and decoder circuitry 14 to tune to the first PRESET frequency in the newly selected program type. It can thus be appreciated that a user may "scroll" through the available program types via successive depressions of the SELECT key $38_4$.

Figure 9:
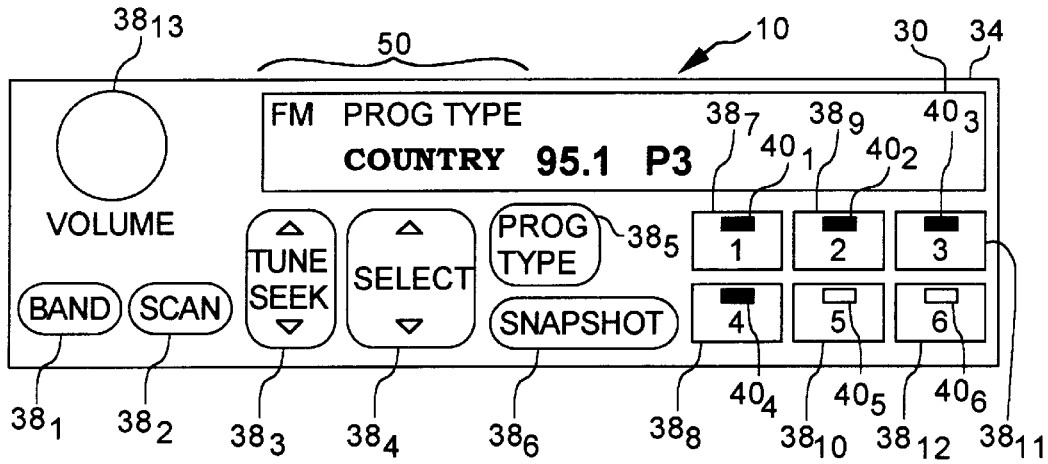
FIG. 9 is a diagrammatic illustration of the user interface of FIG. 8 showing selection of an alternate available broadcast signal in the selected program type, in accordance with the present invention.

Algorithm execution continues from either the No branch of step 132 or from step 134 at step 136 where computer 12 determines whether any of the PRESET keys $38_7$–$38_{12}$ have been depressed. If not, algorithm execution continues at step 142 of FIG. 3D. If, on the other hand, computer 12 determines at step 136 that one of the PRESET keys $38_7$–$38_{12}$ have been depressed, algorithm execution continues at step 138 of FIG. 3D wherein computer 12 determines whether a broadcast frequency of an available broadcast signal is stored in memory 15 and associated with the depressed PRESET key. If not, depression of such a PRESET key has no effect and algorithm execution continues at step 142. If, on the other hand, a broadcast frequency of an available broadcast signal is stored in memory 15 and associated with the depressed PRESET key, computer 12 directs tuner and decoder circuit 14 at step 140 to tune receiver system 10 to the broadcast frequency stored in memory 15 and associated with the depressed PRESET key. This feature is illustrated in FIG. 9 wherein receiver system 10, initially configured as shown in FIG. 8, is shown after a user thereof has depressed PRESET key $38_{11}$. PRESET 3 (key $38_{11}$) corresponds to program frequency 95.1 MHZ (FIG. 7), so that computer 12 displays program frequency 95.1 on display 30 along with P3, thereby indicating that 95.1 is the program frequency stored in PRESET 3 (corresponding to key $38_{11}$).

Algorithm execution continues from any of steps 136, 138 or 140 at step 142 where computer 12 determines whether the TUNE/SEEK key 383 has been depressed. If not, algorithm execution continues at step 146. If, on the other hand, computer 12 determines at step 142 that the TUNE/SEEK key $38_3$ has been depressed, algorithm execution continues at step 144 where computer 12 directs tuner and decoder circuitry 14 to tune the receiver system 10 to the next or previous stored frequency in the currently selected program type category, depending upon whether the up arrow or down arrow of key $38_3$ is depressed as discussed hereinabove.

Algorithm execution continues from step 142 or step 144 at step 146 where computer 12 determines whether the SCAN key $38_2$ has been depressed. If not, algorithm execution continues at step 152 where algorithm execution is returned to its calling routine (or alternatively loops back to step 102). If, at step 146, computer 12 determines that the SCAN key 38$_2$ has been depressed, algorithm execution continues at step 148 where computer 12 directs tuner and decoder circuitry 14 to SCAN to the next program frequency stored in the currently selected program type category, wherein such a SCAN function is described hereinabove. Algorithm execution continues from step 148 at step 150 where computer 12 determines whether the SCAN key 38$_2$ has again been depressed. If so, algorithm execution continues at step 152. If, at step 150, computer 12 determines that the SCAN key 38$_2$ has not been depressed a second time, algorithm execution loops back to step 148 where the SCAN function continues.

It should now be appreciated that the foregoing embodiment of the present invention overcomes shortcomings of prior art systems by providing a program type SNAPSHOT feature that searches at least the FM broadcast frequency band to determine what program types are currently available. Only the currently available program types and corresponding program frequencies are stored and made available to the user. The broadcast signals found during the SNAPSHOT search are sorted and grouped by program type, and the broadcast frequencies in each program type category are stored in PRESETs with a separate bank of PRESETS defined for each available program type.

Figure 10:
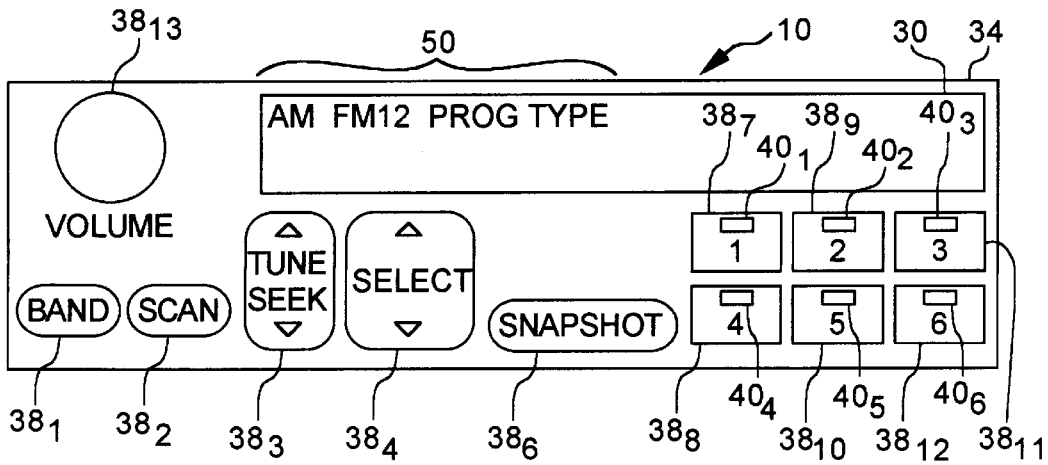
FIG. 10 is a diagrammatic illustration of another preferred embodiment of the user interface of FIG. 1, in accordance with another aspect of the present invention.

Referring now to FIG. 10, an alternate embodiment 10' of the receiver system of the present invention includes an alternate user interface 34'. Structurally, user interface 34' is identical in most respects to user interface 34 of FIGS. 2 and 4–9, with the exception that the PROG TYPE key 38. is omitted from interface 34'. In the operation of receiver system 10', enablement of the program type operational mode is controlled via the BAND key 38$_1$ or the SNAPSHOT key 38$_6$, and disablement of the program type operational mode is controlled via the BAND key 38$_1$ alone as will be described in greater detail hereinafter.

Figure 11A:
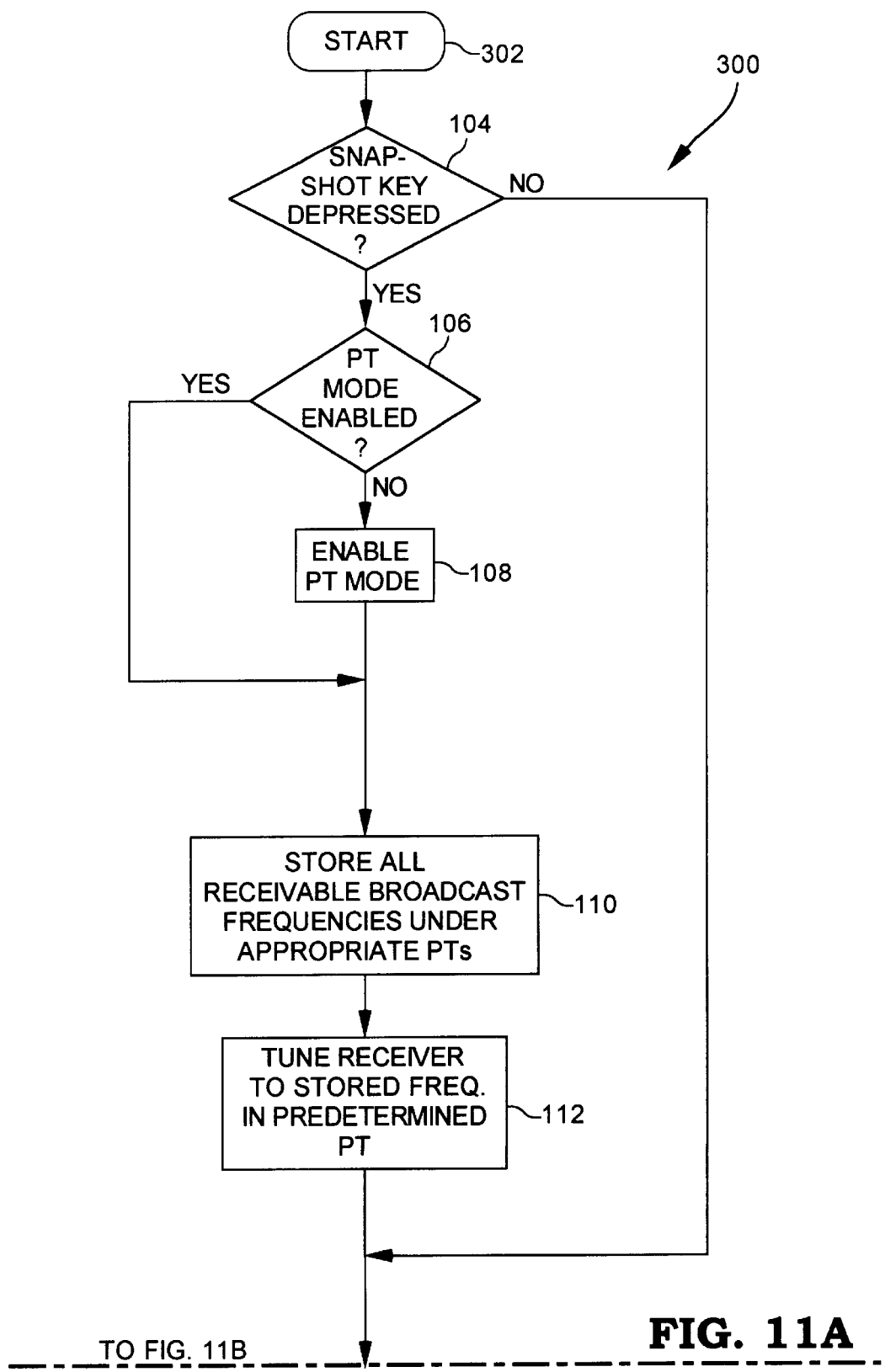
FIG. 11 is composed of FIGS. 11A and 11B and is a flowchart illustrating one preferred embodiment of a software algorithm for implementing the present invention in a system such as that illustrated in FIG. 10.
Figure 11B:
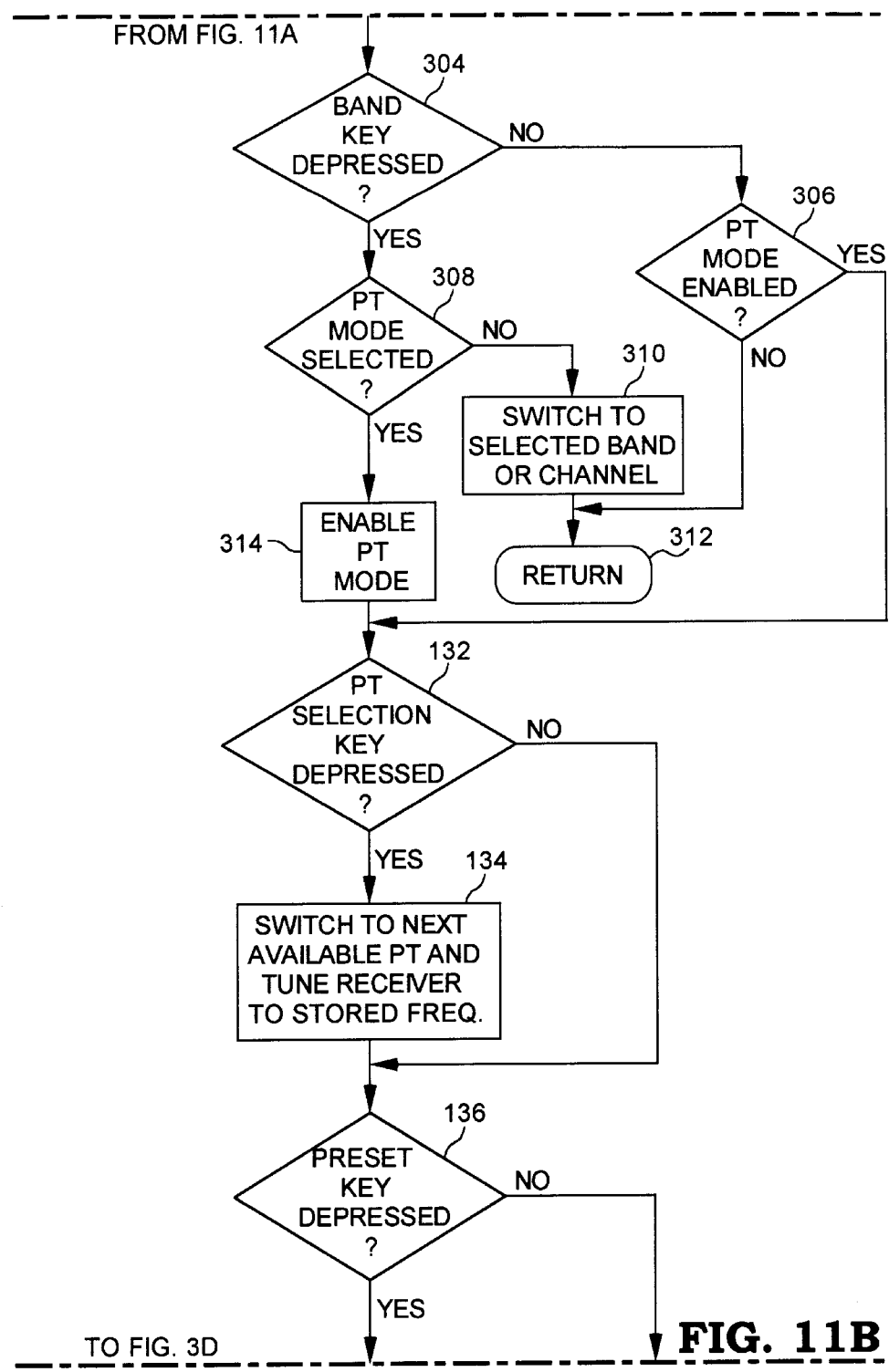

Referring now to FIG. 11, which is composed of FIGS. 11A and 11B, a flowchart is shown illustrating a preferred embodiment of part of a software algorithm 300, executable by computer 12, for implementing the program type feature of the present invention in a receiver system such as system 10' illustrated in FIG. 10. It is to be understood that some of the steps of algorithm 300 are identical to steps shown and discussed hereinabove with respect to algorithm 100, and like steps will therefore be identified with like reference numbers. Referring to FIG. 11A, algorithm 300 starts at step 302, and at step 104, computer 12 determines whether the SNAPSHOT key 38$_6$ has been depressed. If not, algorithm execution continues as step 304 of FIG. 11B. If, on the other hand, computer 12 determines at step 104 that the SNAPSHOT key 38$_5$ has been depressed, algorithm execution continues at step 106 where computer 12 determines whether the program type operational mode (PT) is currently enabled. If so, algorithm execution continues at step 110. If, on the other hand, computer 12 determines at step 106 that the PT mode is not currently enabled, algorithm execution continues at step 108 where computer 12 enables the program type operational mode of the present invention as previously described.

From either of steps 106 or 108, algorithm execution continues at step 110 where computer 12 is operable to store all receivable broadcast frequencies under appropriate program type categories in memory 15, and thereafter at step 112 where computer 12 directs tuner and decoder circuitry 14 to tune receiver system 10' to a program frequency stored in a predetermined one of the program type categories, wherein steps 110 and 114 are more fully described hereinabove.

From either the NO branch of step 104 or from step 112, execution of algorithm 300 continues at step 304 of FIG. 11B wherein computer 12 determines whether the BAND key 38$_1$ has been depressed. If not, algorithm execution continues at step 306 where computer 12 determines whether the program type operational mode is currently enabled. If so, algorithm execution continues at step 132. If, on the other hand, computer 12 determines at step 306 that the PT mode is not currently enabled, algorithm execution continues at step 312 where the algorithm is returned to its calling routine (or alternatively loops back to step 302).

If, at step 304, computer 12 determines that the BAND key 38$_1$ has been depressed, algorithm execution continues at step 308 where computer 12 determines whether the PT mode has been selected by depression of the BAND key 38$_1$. In accordance with the present embodiment, the BAND key 38$_1$ may be successively depressed to select AM band operation, FM band operation in a first FM channel (FM1) having a number of PRESET frequencies associated therewith (and selectable via PRESET keys 38$_7$–38$_{12}$), FM band operation in a second FM channel (FM2) also having a number of PRESET frequencies associated therewith (and selectable via PRESET keys 38$_7$–38$_{12}$) and finally program type operation. As illustrated in FIG. 10, the icon section 50 preferably includes AM, FM12 and PROG TYPE icons, and computer 12 controls display 30 to display an appropriate icon (or combination of icons) to indicate an operational mode of receiver system 10'.

If, at step 308, computer 12 determines that depression of the BAND key 38$_1$ has selected a particular frequency band or channel rather than the PT operational mode, algorithm execution continues at step 310 where computer 12 directs tuner and decoder circuitry 14 to switch to the selected frequency band or channel, and thereafter to step 312 where algorithm 300 is returned to its calling routine (or alternatively back to step 302). If, on the other hand, computer 12 determines at step 308 that depression of the BAND key 38$_1$ has selected the PT operational mode, algorithm execution continues at step 314 where computer 12 directs receiver system 10' to enable the PT mode of operation. Preferably, step 314 is carried out in a manner identical to that described with respect to step 108 of FIG. 3A.

Figure 3D:
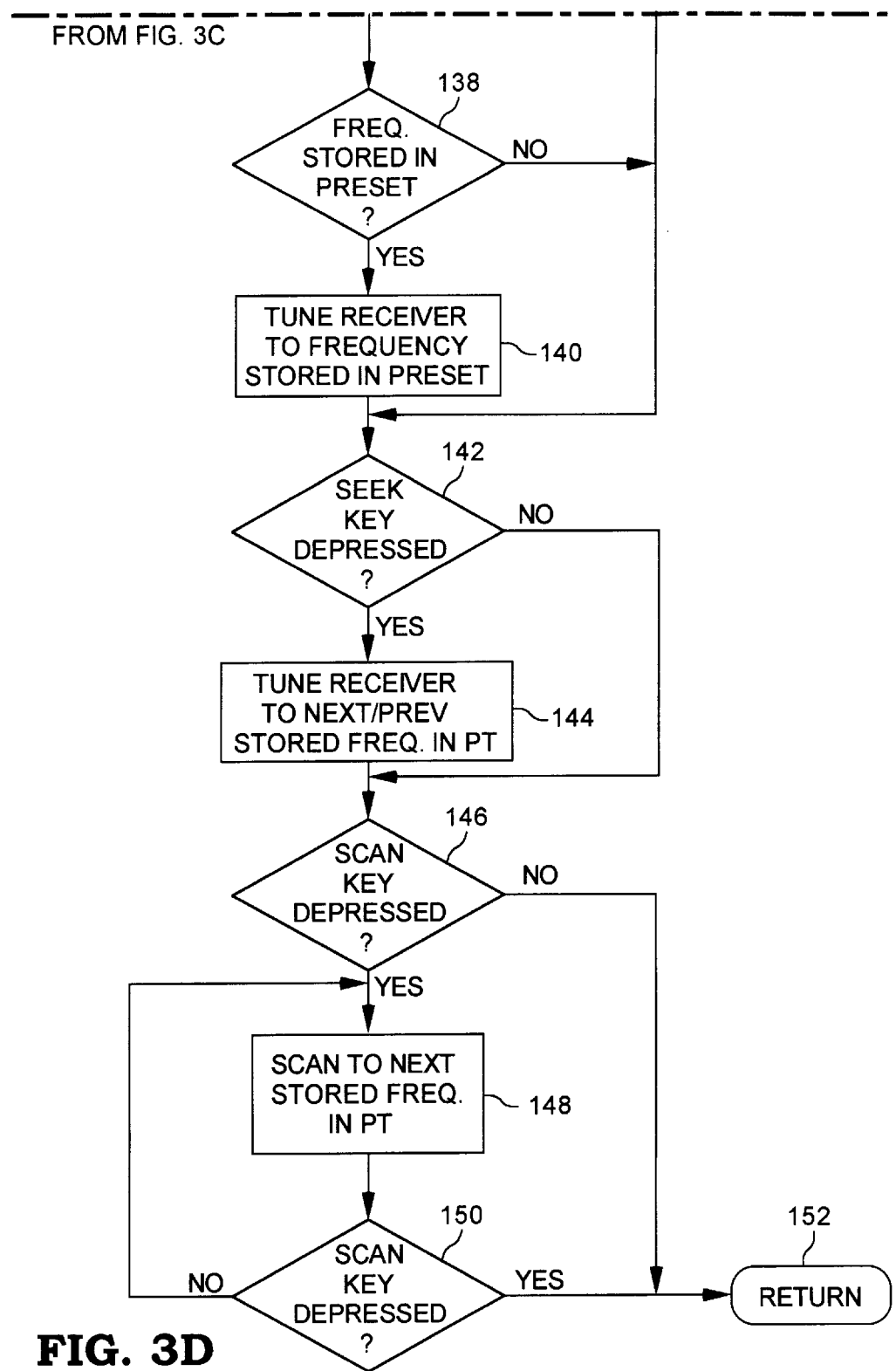

From either the YES branch of step 306 or from step 314, algorithm execution continues, as described hereinabove, through steps 132–152, which are identical to those steps having identical reference identifiers in FIGS. 3C–3D. In fact, step 136 of FIG. 11B preferably leads to step 138 or step 142 of FIG. 3D, wherein the steps of FIG. 3D, as they relate to algorithm 300 are identical to those described with respect to algorithm 100 with the exception that the return step 152 returns algorithm to its calling routine, or alternatively loops algorithm 300 back to step 302.

In accordance with yet another alternative embodiment of the present invention, either of receiver systems 10 or 10' may be made to operate in accordance with the program type operational mode described hereinabove, wherein the broadcast signals received via antenna 18 do not include any accompanying supplemental information. In such an alternative embodiment, memory 15 of receiver system 10 or 10' includes such supplemental information stored therein. Preferably, memory 15 has reserved therein storage blocks for all possible program type categories, and further has stored therein, such as in a look up table, unique supplemental information corresponding to each broadcast frequency. During a SNAPSHOT operation, computer 12 directs tuner and decoder circuit 14 to search through the frequency band, compare the broadcast frequency of each available stations with broadcast frequencies stored in memory 15, determine the corresponding program type categories (as well as any other desired supplemental information) from the supplemental information stored in memory 15 that have broadcast frequencies matching that of the available broadcast frequencies, and storing the available broadcast frequencies in PRESET locations of the preexisting program type storage blocks within memory 15. In this SNAPSHOT process, computer 12 keeps track of which program type memory blocks include available program frequencies, and makes only those program types having available program frequencies selectable by the user via the SELECT key $38_4$ as described hereinabove. It is to be understood that either of the algorithms 100 or 300 described hereinabove may be used by receiver system 10 or 10' to provide for the program type operation of the present invention when the broadcast signals received via antenna 18 do not include accompanying supplemental information. In such algorithms, step 110 of the SNAPSHOT process are preferably modified as just described.

The present invention recognizes that identical program frequencies are typically used for different broadcast stations when such stations exist in sufficiently different broadcast areas. In order to correctly match an available broadcast frequency with its actual broadcast station, as required by the embodiment of the present invention just described, receiver system 10 or 10' require inclusion therein a subsystem operable to select appropriate stations based upon geographical location. One such known system is described in U.S. Pat. No. 4,969,209, issued Nov. 6, 1990 to Schwob and assigned to PRS Corporation, the contents of which are incorporated herein by reference.

In accordance with yet another embodiment of the present invention, tuner and decoder circuitry 14 comprises two tuner and decoder circuits, preferably identical, wherein the first such circuit performs the tuning and decoding functions described hereinabove, and wherein the second tuner and decoder circuit automatically operates in the above-described SNAPSHOT mode at predetermined time intervals. In this embodiment, the SNAPSHOT key $38_6$ may thus be omitted, and computer 12 is operable to direct the second tuner and decoder circuit to automatically search the frequency band for available program frequencies and provide such SNAPSHOT data to computer 12 for storage therein at the predetermined time intervals. In either algorithm 100 or 300, steps 104–108 are omitted therefrom, and steps 110–112 are periodically performed at the predetermined time intervals. The remaining steps of either algorithm may be executed by computer 12 as described hereinabove to control such a receiver system having two tuner and decoder circuits.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected. For example, while the concepts illustrated and described hereinabove have been so described with respect to a broadcast radio frequency receiver, those skilled in the art will recognize that such concepts may be readily adapted without undue experimentation to broadcast television systems as well as nonbroadcast communication systems, including pre-recorded media-based systems. As another example, while the various embodiments of the present invention have been described herein as storing the program or broadcast frequencies of each available broadcast signal, those skilled in the art will recognize that computer 12 may alternatively be operable to store program identification codes and related frequencies, such as in networked systems, wherein such information may alternatively be used to present available programs to the user.

The embodiments of the invention in which an exclusive property or privilege is claimed are defined as follows:

1. In a communication receiver operable to receive and decode communication signals having accompanying supplemental information, a method of creating selectable categories of available communication signals comprising the steps of:

searching a band of communication frequencies for all currently available communication signals; and for each of the currently available communication signals, performing the steps of determining a signal category from decoded supplemental information accompanying the communication signal;

creating the signal category in a memory of the communication receiver unless the signal category preexists therein; and storing in the signal category of the memory a communication frequency of the communication signal.

2. The method of claim 1 wherein the communication signals are broadcast signals;

and wherein the searching step includes searching an FM radio frequency band for all currently available FM broadcast signals.

3. The method of claim 1 wherein the signal categories correspond to program type categories of the currently available communication signals.

4. The method of claim 3 wherein the supplemental information includes a predefined number of unique program type categories.

5. The method of claim 4 wherein the communication signals are broadcast signals;

and wherein the storing step includes storing in the program type category of the memory a broadcast frequency of the broadcast signal.

6. The method of claim 1 further including the steps of:

selecting any of the stored signal categories;

selecting any of the communication frequencies stored in the selected signal category; and tuning the receiver to receive and decode the selected communication frequency.

7. In a communication receiver operable to receive and decode communication signals having accompanying program type information, a method of selectively tuning the receiver to available communication frequencies of various program types comprising the steps of:

searching a band of communication frequencies for all currently available communication signals;

determining a program type of each of the currently available communication signals from program type information thereof;

storing program types of each of the currently available communication signals in a memory of the communication receiver unless such program types preexist therein;

storing communication frequencies of each of the currently available communication signals in the memory according to program type;

selecting one of the program types stored in the memory;

selecting one of the communication frequencies of the selected program type; and tuning the communication receiver to the selected communication frequency.

8. The method of claim 7 wherein the communication signals are broadcast signals;

and wherein the searching step includes searching an FM radio frequency band for all currently available FM broadcast signals.

9. The method of claim 7 wherein the program type information includes a predefined number of unique program type categories.

10. A communication receiver comprising:

a keypad including a number of keys each responsive to user depression thereof to produce a predefined key signal;

tuning and decoding circuitry for receiving and decoding communication signals having accompanying supplemental information; and a computer connected to said keypad and to said tuning and decoding circuitry, said computer including means responsive to depression of a first one of said keys for directing said tuning and decoding circuitry to search a first band of communication frequencies for all currently available communication signals;

means for determining a signal category for each of the currently available communication signals from the decoded supplemental information thereof;

means for storing the signal categories; and means for storing communication frequencies of each of the currently available communication signals according to signal category.

11. The communication receiver of claim 10 wherein said first band of communication frequencies includes an FM radio frequency band.

12. The communication receiver of claim 10 wherein said signal categories include program type information;

and wherein said means for storing communication frequencies includes means for storing communication frequencies of each of the currently available communication signals according to program type.

13. The communication receiver of claim 10 further including a display responsive to a number of display signals provided by said computer to display visual information relating to operation of said communication receiver.

14. The communication receiver of claim 10 wherein said computer further includes:

means responsive to depression of a second one of said keys for selecting a stored one of said signal categories;

means responsive to depression of a third one of said keys for selecting a stored one of said communication frequencies of a selected signal category;

means responsive to a selected one of said communication frequencies for directing said tuning and decoding circuitry to tune and decode communication signals having said selected communication frequency.

15. The communication receiver of claim 14 wherein said computer further includes means responsive to depression of a fourth one of said keys for directing said tuning and decoding circuitry to tune and decode communication signals in a second band of communication frequencies.

16. The communication receiver of claim 15 wherein said computer further includes means responsive to depression of a fifth one of said keys for directing said tuning and decoding circuitry to tune and decode a next numerically higher stored communication frequency.

17. The communication receiver of claim 16 wherein said computer further includes means responsive to depression of a sixth one of said keys for directing said tuning and decoding circuitry to SCAN each stored communication frequency in a selected signal category.

18. A communication receiver comprising:

tuning and decoding circuitry for receiving and decoding communication signals; and a computer connected to said tuning and decoding circuitry, said computer including means for directing said tuning and decoding circuitry to search a first band of communication frequencies for all currently available communication signals;

memory storing communication frequencies and associated signal categories of a number of communication sources;

means for matching communication frequencies of each of said currently available communication signals with communication frequencies of said communication sources in said memory to thereby identify signal categories for each of the currently available communication signals; and means for identifying available signal categories and associated ones of the currently available communication signals.

* * * * *

UNITED STATES PATENT AND TRADEMARK OFFICE
CERTIFICATE OF CORRECTION

| | |
|---|---|
| PATENT NO. | : 6,021,320 |
| APPLICATION NO. | : 08/866118 |
| DATED | : February 1, 2000 |
| INVENTOR(S) | : Brian Lee Bickford et al. |

It is certified that error appears in the above-identified patent and that said Letters Patent is hereby corrected as shown below:

Page 1, right column, Abstract, line 1, change "Broadcast" to --broadcast--; and
line 4, change "are" to --is--.

In FIG. 10, change "10" to --10'-- and change "34" to --34'--.

Column 1, line 59, insert --of-- after --number--.

Column 3, line 63, change "purposes" to --purpose--.

Column 4, line 14, change "I" to --$i$--.

Column 8, line 8, insert --200-- after --types--; and
line 41, change "$3_8$" to --$38_8$--.

Column 9, line 63, insert --is-- after --mode--.

Column 10, line 15, change "No" to --NO--;
line 27, change "No" to --NO--; and
line 55, change "383" to --$38_3$--.

Column 11, line 32, change "38." to --$38_5$--; and
line 53, change "$38_5$" to --$38_6$--.

Column 12, line 2, change "114" to --304--; and
line 55, insert --300-- after --algorithm--.

Column 13, line 5, change "stations" to --station--;
line 23, change "are" to --is--; and
line 31, change "require" to --requires-- and insert --of-- after --therein--.

Claim 1, line 6, change "searching a band" to --non-disruptively searching an entire band--.

Claim 7, line 6, change "searching a band" to --non-disruptively searching an entire band--.

Signed and Sealed this
Nineteenth Day of June, 2012

David J. Kappos
*Director of the United States Patent and Trademark Office*

CERTIFICATE OF CORRECTION (continued)
U.S. Pat. No. 6,021,320

Claim 10, line 12, change "search a first band" to --non-disruptively search an entire first band--.

Claim 17, line 4, change "SCAN" to --scan--.

Claim 18, line 7, change "search a first band" to --non-disruptively search an entire first band--.